United States Patent
Zampini et al.

(10) Patent No.: US 9,323,154 B2
(45) Date of Patent: Apr. 26, 2016

(54) COATING COMPOSITIONS FOR PHOTOLITHOGRAPHY

(75) Inventors: Anthony Zampini, Westborough, MA (US); Michael K. Gallagher, Hopkinton, MA (US); Owendi Ongayi, Marlborough, MA (US)

(73) Assignee: Rohm and Haas Electronic Materials, LLC, Marlborough, MA (US)

( * ) Notice: Subject to any disclaimer, the term of this patent is extended or adjusted under 35 U.S.C. 154(b) by 25 days.

(21) Appl. No.: 11/786,319

(22) Filed: Apr. 11, 2007

(65) Prior Publication Data

US 2007/0238052 A1     Oct. 11, 2007

Related U.S. Application Data

(60) Provisional application No. 60/791,547, filed on Apr. 11, 2006.

(51) Int. Cl.
  *G03F 7/11* (2006.01)
  *G03F 7/32* (2006.01)
  *G03F 7/40* (2006.01)
  *G03F 7/09* (2006.01)
  *H01L 21/027* (2006.01)

(52) U.S. Cl.
  CPC *G03F 7/091* (2013.01); *G03F 7/11* (2013.01); *G03F 7/322* (2013.01); *G03F 7/40* (2013.01); *H01L 21/0275* (2013.01); *H01L 21/0276* (2013.01)

(58) Field of Classification Search
  CPC ............. G03F 7/091; G03F 7/11; G03F 7/40; G03F 7/322; H01L 21/0271; H01L 21/0273; H01L 21/0274; H01L 21/0275; H01L 21/0276
  USPC ............. 430/270.1, 273.1, 276.1, 281.1, 311, 430/317; 438/257, 636, 654, 657, 778, 780, 438/781, 782
  See application file for complete search history.

(56) References Cited

U.S. PATENT DOCUMENTS

| | | | |
|---|---|---|---|
| 7,326,523 B2 * | 2/2008 | Huang et al. | 430/313 |
| 8,142,988 B2 | 3/2012 | Zampini et al. | |
| 8,968,981 B2 | 3/2015 | Jain et al. | |
| 2002/0172896 A1 * | 11/2002 | Adams et al. | 430/322 |
| 2004/0253461 A1 | 12/2004 | Ogihara et al. | |
| 2004/0265754 A1 | 12/2004 | Barclay et al. | |
| 2005/0074689 A1 | 4/2005 | Angelopoulos et al. | |
| 2005/0181299 A1 * | 8/2005 | Trefonas et al. | 430/270.1 |
| 2005/0214674 A1 * | 9/2005 | Sui et al. | 430/270.1 |
| 2005/0238997 A1 | 10/2005 | De et al. | |
| 2006/0019195 A1 | 1/2006 | Hatakeyama et al. | |
| 2007/0178406 A1 * | 8/2007 | Vohra et al. | 430/270.1 |
| 2007/0264580 A1 | 11/2007 | Zampini et al. | |
| 2014/0030653 A1 | 1/2014 | Zampini et al. | |

FOREIGN PATENT DOCUMENTS

JP     2006-053404 A     2/2006

OTHER PUBLICATIONS

European Search Report of corresponding European Application No. 07 00 7293.
English Summary of Chinese Decision on Rejection of corresponding Chinese Application No. 200710105399.X issued Mar. 13, 2013.
English language summary of Korean counterpart application 10-2014-0024873.
English summary of Office Action of counterpart Chinese Application 20071015399.X.
English Language Summary of Office Action issued in Counterpart Korean Application No. 10-2014-0024873 (2 Pages).

* cited by examiner

*Primary Examiner* — Amanda C Walke
(74) *Attorney, Agent, or Firm* — Mintz Levin Cohn Ferris Glovsky and Popeo, P.C.; Peter F. Corless

(57) ABSTRACT

In a first aspect, methods are provided that comprise: (a) applying a curable composition on a substrate; (b) applying a hardmask composition above the curable composition; (c) applying a photoresist composition layer above the hard mask composition, wherein one or more of the compositions are removed in an ash-free process. In a second aspect, methods are provided that comprise (a) applying an organic composition on a substrate; (b) applying a photoresist composition layer above the organic composition, wherein the organic composition comprises a material that produce an alkaline-soluble group upon thermal and/or radiation treatment. Related compositions also are provided.

7 Claims, No Drawings

COATING COMPOSITIONS FOR PHOTOLITHOGRAPHY

This application claims the benefit of U.S. Provisional Application No. 60/791,547, filed Apr. 11, 2006, which is incorporated herein by reference.

This invention relates generally to the field of manufacture of electronic devices. In particular, this invention relates to the manufacture of integrated circuit devices containing through use of improved processes and compositions.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components.

A variety of organic and inorganic porous dielectric materials are known in the art in the manufacture of electronic devices, particularly integrated circuits. Suitable inorganic dielectric materials include silicon dioxide and organic polysilicas. Suitable organic dielectric materials include thermosets such as polyimides, polyarylene ethers, polyarylenes, polycyanurates, polybenzazoles, benzocyclobutenes, fluorinated materials such as poly(fluoroalkanes), and the like. Of the organic polysilica dielectrics, the alkyl silsesquioxanes such as methyl silsesquioxane are of increasing importance because of their low dielectric constant.

In processes with dielectric underlayers, plasma "ashing" has been employed to strip both photoresist materials and remove a portion of the underlying dielectric material. See U.S. 2005/0077629. Ashing has referred to a plasma stripping process wherein photoresist and post-etch materials are removed from a substrate by the plasma. Ashing often may be performed after an etching or implant process. For at least certain applications, ashing may be less than optimal, e.g., the ashing plasma may undesirably degrade various formed layers in the electronic device being manufactured.

The use of underlayer and spin-on hard mask is one method for achieving the desired low damage integration approach needed to allow the implementation of low k dielectric materials for 65 nm node and below. In addition, to solving the ash damage issue, these stacks offer improved lithographic and performance. Lithographic performance is enhanced due to minimization of reflectivity from the substrate surface. While etch performance is enhanced through the use of layers that are etched with different etch gases. In particular photoresist is used to pattern transfer into a silicon material and the silicon material is used to transfer the pattern into the carbon underlayer. Finally for device manufacture the pattern is transferred into an inorganic substrate such as silicon dioxide, silicon nitride, polysilicon, titanium nitride, gate metal and other substrates known to those skilled in the art of device manufacture.

We now provide new methods and compositions for producing electronic devices, including integrated circuits.

In a first aspect, methods are provided that comprise: (a) applying a curable composition on a substrate; (b) applying a hardmask composition above the curable composition; (c) applying a photoresist composition layer above the hard mask composition, wherein one or more of the compositions are removed in an ash-free process. In such aspects, preferably, the hardmask composition layer and/or the curable underlying composition layer is removed e.g. through use of one or more organic solvent and/or aqueous alkaline compositions.

In preferred aspects, the curable composition may comprise one or more organic resins that are suitably formed by polymerization of vinyl monomers or oligomers such acrylates, methacrylates, vinyl aromatic compounds such as styrenic compounds, and other vinyl compounds. Such curable compositions also preferably comprise a crosslinker in addition to a resin component, preferably where the crosslinker is resistant to significant sublimation during thermal processing. Preferred crosslinkers may include multifunctional monomer compounds.

In one embodiment, the curable composition may comprise a crosslinker component but not a separate resin component. Preferred curable composition may comprise a curing catalyst e.g. a free-radical polymerization catalyst to facilitate hardening of the composition such as through blanket exposure to activating radiation (e.g. 400 nm or less or 300 nm or less) after application of a coating layer of the composition on a substrate.

In a second aspect of the invention, methods are provided that comprise (a) applying an organic composition on a substrate; (b) applying a photoresist composition layer above the organic composition, wherein the underlying organic composition comprises a material that can produce an alkaline-soluble group upon thermal and/or radiation treatment.

In this second aspect of the invention, the underlying organic composition may suitably comprises a resin comprising one or more photoacid-labile and/or thermally-labile groups, such as photoacid-labile ester or acetal groups, such as may be provided e.g. by polymerization of an acrylate ester including t-butylacrylate and t-butylmethacrylate. The underlying organic composition also may suitably comprise one or more anhydride groups.

In this aspect of the invention, the underlying compositions also may comprise one or more chromophore groups to thereby enhance functionality as antireflective layers for an overcoated photoresist layer. Preferred chromophore groups are aromatic groups such as phenyl groups for use with an overcoated photoresists imaged at 193 nm and anthracene and naphthylene groups for use with overcoated photoresists imaged at 248 nm.

In this aspect of the invention, after the underlying composition has been applied it may be thermally treated, e.g. at 150° C., 200° C. or 250° C. or more, which can cause deprotection of the labile groups present in the composition to provide aqueous alkaline-soluble groups. For instance, under such thermal treatment a t-butyl ester group can be deprotected to form an acid (—COOH group). Those liberated carboxylic acid groups also can undergo inter and intra molecular cross-linking such as to yield anhydride groups and provide a coating composition layer that is insoluble to the subsequently applied photoresist layer. However, sufficient carboxylic groups (i.e. not formed into anhydride groups) can remain to provide solubility of the underlying layer in aqueous alkaline developer used to develop the overcoated resist layer, thereby enabling development of both the resist and underlying composition layer in a single development step.

In such aspects of the invention, the underlying coating composition does not need to contain an additional crosslinker component (such as an amine material) as has been employed in prior underlying antireflective coating compositions. Thus, the underlying coating composition may be at least substantially, essentially or completely free of an added crosslinker component such as an amine material. An underlying coating composition will be at least substantially free of crosslinker if less than 5, 4, 3, 2 or 1 weight percent solids (all components except solvent carrier) are other than a crosslinker such as an amine-based material (e.g. benzoguanamine or melamine material).

In such aspects of the invention, the underlying coating composition optionally may comprise acid or an acid generator (e.g. photoacid-generator or thermal acid generator) to facilitate deblocking and generation of carboxylic acid groups upon thermal treatment.

The invention also provides compositions useful in the above described methods.

Thus, in one aspect, curable coating compositions are provided suitable for use in an ash-free removal process. As discussed above, the curable compositions may suitably comprise one or more organic resins that are suitably formed by polymerization of vinyl monomers or oligomers such acrylates, methacrylates, vinyl aromatic compounds such as styrenic compounds, and other vinyl compounds. Such curable compositions also preferably comprise a crosslinker (e.g. a multifunctional monomer) in addition to a resin component, preferably where the crosslinker is resistant to significant sublimation during thermal processing. For example, preferred crosslinkers will have a molecular weight of about 100, 200, 300, 400, 500 or 1000 great to provide sublimation resistance.

In a further aspect, underlying coating compositions are provided that comprise a component that comprise thermally-labile or acid-labile groups which can provide acid groups (e.g. —COOH groups) upon thermal treatment. This component may suitably comprise one or more resins that comprise thermally-labile or acid-labile groups. The compositions also may optionally comprise an acid or acid generator compound, such as a photoacid-generator compound or thermal-acid generator compound. In preferred aspects, the compositions may be at least substantially free of a separate crosslinker component, such as an amine-based material and/or a multifunctional monomer. The composition also may comprise a component that comprises one or more chromophore groups, such as aromatic groups, particularly to facilitate antireflective properties of the coating composition.

A variety of photoresists may be used in combination (i.e. overcoated) with a coating composition of the invention. Preferred photoresists for use with the antireflective compositions of the invention are chemically-amplified resists, especially positive-acting photoresists that contain one or more photoacid generator compounds and a resin component that contains units that undergo a deblocking or cleavage reaction in the presence of photogenerated acid, such as photoacid-labile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as about 248 nm, or radiation having a wavelength of less than about 200 nm, such as 193 nm.

The invention further provides methods for forming a photoresist relief image an electronic devices as well as novel articles of manufacture comprising substrates (such as a microelectronic wafer substrate) coated with a coating composition of the invention alone or in combination with a photoresist composition.

Other aspects of the invention are disclosed infra.

Curable Coating Compositions (Useful in Ash-Free Processing):

Resins

Polymers suitable for use in curable compositions of the invention include those derived from ethylenically or acetylenically unsaturated monomers and are removable, such as by the unzipping of the polymer chains to the original monomer units which are volatile and diffuse readily through the host matrix material. By "removable" is meant that the polymer particles depolymerize, degrade or otherwise break down into volatile components which can then diffuse through the host dielectric matrix film. Suitable unsaturated monomers include, but are not limited to: (meth)acrylic acid, (meth)acrylamides, alkyl (meth)acrylates, alkenyl (meth)acrylates, aromatic (meth)acrylates, vinyl aromatic monomers, nitrogen-containing compounds and their thio-analogs, and substituted ethylene monomers.

Alkyl (meth)acrylates useful in resins of the present curable compositions include ($C_1$-$C_{24}$) alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25 L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the resins of the present curable compositions may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$-$C_6$)alkyl (meth)acrylates, dialkylamino($C_2$-$C_6$)-alkyl (meth)acrylates, dialkylamino($C_2$-$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$-$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or "HPMA."

Other substituted (meth)acrylate and (meth)acrylamide monomers useful in resins of the present curable compositions are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethyl-aminopropyl methacrylamide, N,N-dimethylaminobutyl methacrylamide, N,N-diethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in resins of the present curable compositions are silicon-containing monomers such as γ-propyl tri($C_1$-$C_6$)alkoxysilyl (meth)acrylate, γ-propyl tri($C_1$-$C_6$)alkylsilyl (meth)acrylate, γ-propyl di($C_1$-$C_6$)alkoxy($C_1$-$C_6$)alkylsilyl (meth)acrylate, γ-propyl di($C_1$-$C_6$)alkyl($C_1$-$C_6$)alkoxysilyl (meth)acrylate, vinyl tri($C_1$-$C_6$)alkoxysilyl (meth)acrylate, vinyl di($C_1$-$C_6$)alkoxy($C_1$-$C_6$)alkylsilyl (meth)acrylate, vinyl ($C_1$-$C_6$)alkoxydi($C_1$-$C_6$)alkylsilyl (meth)acrylate, vinyl tri($C_1$-$C_6$)alkylsilyl (meth)acrylate, and mixtures thereof.

Vinylaromatic monomers useful as unsaturated monomers in resins of the present curable compositions include, but are not limited to: styrene ("STY"), α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$-$C_{10}$)alkoxy, halo($C_1$-$C_{10}$)alkyl, carb($C_1$-$C_{10}$)alkoxy, carboxy, amino, ($C_1$-$C_{10}$)alkylamino derivatives and the like.

Nitrogen-containing compounds and their thio-analogs useful as unsaturated monomers in resins of the present curable compositions include, but are not limited to: vinylpyridines such as 2-vinylpyridine or 4-vinylpyridine; lower alkyl ($C_1$-$C_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

Substituted ethylene monomers useful as unsaturated monomers in resins of the present curable compositions include, but are not limited to: allylic monomers, vinyl acetate, vinyl formamide, vinyl chloride, vinyl fluoride, vinyl bromide, vinylidene chloride, vinylidene fluoride and vinylidene bromide.

The solution polymers useful in the present invention may be linear or branched and may be copolymers or homopolymers. Suitable solution polymers useful as resins in the present curable compositions include, but are not limited to: butyl acrylate homopolymers, ethylhexyl acrylate-methyl methacrylate copolymers, isodecyl methacrylate-methyl methacrylate copolymers, butyl acrylate-methyl methacrylate copolymers, and benzyl methacrylate-methyl methacrylate copolymers. Typically, the molecular weight of these polymers is in the range of 10,000 to 1,000,000, preferably 20,000 to 500,000, and more preferably 20,000 to 100,000. The polydispersity of these materials is in the range of 1 to 20, preferably 1.001 to 15, and more preferably 1.001 to 10.

Solution polymers of compositions of the invention are prepared in a non-aqueous solvent. Suitable solvents for such polymerizations are well known to those skilled in the art. Examples of such solvents include, but are not limited to: hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and t-butanol.

The solution polymers useful in compositions of the invention are generally prepared by first charging a solvent heel or alternatively a mixture of solvent and some portion of the monomer mixture to a reaction vessel equipped with a stirrer, a thermometer and a reflux condenser. The monomer mixture is typically composed of monomer, initiator and chain transfer agent, as appropriate. The solvent or solvent/monomer mixture heel is heated with stirring under a nitrogen blanket to a temperature from about 55° C. to about 125° C. After the heel charge has reached a temperature sufficient to initiate polymerization, the monomer mixture or balance of the monomer mixture is charged to the reaction vessel over a period of 15 minutes to 4 hours while maintaining the reaction at the desired reaction temperature. After completing the monomer mixture addition, a series of additional aliquots of initiator in solvent are charged to the reaction. Typically, the initiator is charged to the reaction and followed by a hold period to allow for reaction to occur before adding the next initiator amount. Typically three initiator additions are used. After the final initiator amount is added the batch is held for 30 minutes to 4 hours to fully decompose all initiator and drive the reaction to completeness. An alternative method is to first charge both solvent and a portion of the monomer mixture to the reaction vessel.

Emulsion polymers useful in the present curable compositions are generally prepared by first charging water and some portion of the monomer emulsion to a reaction vessel equipped with a stirrer, a thermometer and a reflux condenser. Typically, the monomer emulsion is composed of monomer, surfactant, initiator and chain transfer agent, as appropriate. The initial charge of monomer emulsion is heated with stirring under a nitrogen blanket to a temperature of from about 55° C. to about 125° C. After the seed charge has reached a temperature sufficient to initiate polymerization, the monomer emulsion or balance of the monomer emulsion is charged to the reaction vessel over a period of 15 minutes to 4 hours while maintaining the reaction at the desired reaction temperature. After completing the monomer emulsion addition, a series of additional aliquots of initiator in water are charged to the reaction. Typically the initiator is charged to the reaction and followed by a hold period to allow for reaction to occur before adding the next initiator amount. Typically three initiator additions are used. After the final initiator amount is added, the batch is held for 30 minutes to 4 hours to fully decompose all initiator and drive the reaction to completeness.

In the alternative, the emulsion polymerization may be carried out in a batch process. In such a batch process, the emulsion polymers are prepared by charging water, monomer, surfactant, initiator and chain transfer agent, as appropriate, to a reaction vessel with stirring under a nitrogen blanket. The monomer emulsion is heated to a temperature of from about 55° C. to about 125° C. to carry out the polymerization. After 30 minutes to 4 hours at this temperature, a series of additional aliquots of initiator are charged to the reaction vessel. Typically the initiator is charged to the reaction vessel followed by a hold period to allow for reaction to occur before adding the next amount of initiator. Typically three initiator additions are used. After the final initiator amount is added, the batch is held for 30 minutes to 4 hours to fully decompose all initiator and drive the reaction to completeness.

It is preferred that the polymers for use in the present curable compositions are prepared using anionic polymerization or free radical polymerization techniques. It is also preferred that the polymers useful in the present invention are not prepared by step-growth polymerization processes.

Crosslinkers of Curable Compositions (First Aspect)

Suitable cross-linkers useful in the curable coating compositions include di-, tri-, tetra-, or higher multi-functional ethylenically unsaturated monomers. Examples of crosslinkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane) and mixtures thereof.

Other crosslinkers also will be useful.

As discussed above, preferred crosslinkers will be resistant to sublimination during processing. In particular, higher molecular weight materials will be preferred.

Polymerization Catalyst for Curable Coating Composition (First Aspect)

As discussed above, curable coating compositions also may comprise a polymerization or curing catalyst to facilitate hardening (curing) of the applied composition layer.

A variety of polymerization catalysts may be employed, including e.g. one or more free-radical polymerization catalyst.

Underlying Compositions Having Thermally-Deprotectable Groups to Provide Acid Groups—(Second Aspect)

As discussed above, underlying coating compositions are provided that comprise a component that comprise thermally-labile or acid-labile groups which can provide acid groups (e.g. —COOH groups) upon thermal treatment. This component may suitably comprise one or more resins that comprise thermally-labile or acid-labile groups. The compositions also may optionally comprise an acid or acid generator compound, such as a photoacid-generator compound or thermal-acid generator compound. In preferred aspects, the compositions may be at least substantially free of a separate crosslinker component, such as an amine-based material. The composition also may comprise a component that comprises one or more chromophore groups, such as aromatic groups, particularly to facilitate antireflective properties of the coating composition.

Preferred resins may be copolymers with two or more distinct repeat units. Acrylate resins can be particularly suitable for many applications. Higher order resins also are preferred including terpolymer (three distinct repeat units) and tetrapolymers (four distinct repeat units).

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604 from GE Silicones, or the surfactant FC 171 or FC 431 available from the 3M Company.

Acrylate-based resins can be prepared by known methods, such as polymerization (e.g. in the presence of a radical initiator) of one or more acrylate monomers such as e.g. hydroxyethylmethylacrylate, hydroxyethylacrylate, methylmethacrylate, butyl methacrylatemethylanthracene methacrylate or other anthracene acrylate and the like. Other monomers including anhydrides such as maleic anhydride can be co-polymerized with acrylate monomers. For use in antireflective compositions, one or more co-polymerized monomers can contain suitable chromophore groups, such as anthracene for use in antireflective coating compositions utilized with an overcoated photoresist imaged with 248 nm radiation, or phenyl for use in an antireflective coating composition imaged with 193 nm radiation. See also the examples which follow for suitable syntheses of resins useful in coating compositions of the invention.

Particularly preferred coating compositions of the invention comprise one or more components that comprise anhydride and hydroxyl moieties. In such preferred compositions, anhydride and hydroxyl moieties may be present together on a single composition component such as a resin, e.g. by copolymerizing monomers that contain hydroxyl groups with anhydride monomers. Alternatively, anhydride and hydroxyl moieties may be present together on a distinct composition component such as distinct resins, e.g. where one resin comprises anhydride groups and a distinct resin comprises hydroxyl groups.

As discussed above, for antireflective applications, suitably one or more of the compounds reacted to form the resin comprise a moiety that can function as a chromophore to absorb radiation employed to expose an overcoated photoresist coating layer. For example, a phenyl compound such as styrene or a phenyl acrylate (e.g. benzyl acrylate or benzyl methacrylate) may be polymerized with other monomers to provide a resin particularly useful in an antireflective composition employed with a photoresist imaged at sub-200 nm wavelengths such as 193 nm. Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

For deep UV applications (i.e. the overcoated resist is imaged with deep UV radiation), a polymer of an antireflective composition preferably will absorb reflections in the deep UV range (typically from about 100 to 300 nm). Thus, the polymer preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophore, e.g. groups having from two to three to four fused or separate rings with 3 to 8 members in each ring and zero to three N, O or S atoms per ring. Such chromophores include optionally substituted phenanthryl, optionally substituted anthracyl, optionally substituted acridine, optionally substituted naphthyl, optionally substituted quinolinyl and ring-substituted quinolinyls such as hydroxyquinolinyl groups. Optionally substituted anthracenyl groups are particularly preferred for 248 nm imaging of an overcoated resist. Preferred antireflective composition resins have pendant anthracene groups. Preferred resins include those of Formula I as disclosed on page 4 of European Published Application 813114A2 of the Shipley Company.

Another preferred resin binder comprises optionally substituted quinolinyl groups or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin in an acrylic containing such units, such as resins of formula II disclosed on pages 4-5 of European Published Application 813114A2 of the Shipley Company.

As discussed above, for imaging at 193 nm, the antireflective composition preferably may contain a resin that has phenyl chromophore units. For instance, one suitable antireflective resin for use with photoresists imaged at 193 nm is a terpolymer consisting of polymerized units of styrene, maleic anhydride, and 2-hydroxyethyl methacrylate.

Preferably resins of antireflective compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

While coating composition resins having absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

The concentration of such a resin component of the coating compositions of the invention may vary within relatively broad ranges, and in general the resin binder is employed in a concentration of from about 50 to 95 weight percent of the total of the dry components of the coating composition, more typically from about 60 to 90 weight percent of the total dry components (all components except solvent carrier).

Acid or Acid Generator Compound (Optional Component; Second Aspect)

Coating compositions of the invention may comprise additional optional components. Thus, for example, a coating composition may suitably comprise an added acid source such as an acid or acid generator compound particularly a thermal acid generator compound whereby the applied coating composition can be hardened such as by thermal treatment prior to application of an overcoated photoresist layer.

However, as discussed above, in preferred aspects, coating compositions of the invention may be formulated without such an added acid or acid generator compound(s). Such compositions free or at least essentially free of any added acid or acid generator compounds may provide performance benefits, including enhanced shelf life. As referred to herein a composition that is essentially free of added acid or acid generator compounds has less than 3, 2 or 1 weight percent of added acid or acid generator compounds based on total weight of the formulated solvent-based coating composition. As also referred to herein, an added acid is distinct from residual acid that may be present in a composition, such as residual acid entrapped in a resin remaining from the resin synthesis.

If an added acid or acid generator compound are employed, a coating composition suitably comprises a thermal acid generator compound (i.e. compound that generates acid upon thermal treatment), such as an ionic or substantially neutral thermal acid generator, e.g. an ammonium arenesulfonate salt, for catalyzing or promoting crosslinking during curing of an antireflective composition coating layer. Typically one or more thermal acid generators are present in an antireflective composition in a concentration from about 0.1 to 10 percent by weight of the total of the dry components of the composition (all components except solvent carrier), more preferably about 2 percent by weight of the total dry components.

Coating compositions of the invention also may contain one or more photoacid generator compounds typically in addition to another acid source such as an acid or thermal acid generator compound. In such use of a photoacid generator compound (PAG), the photoacid generator is not used as an acid source for promoting a crosslinking reaction, and thus preferably the photoacid generator is not substantially activated during crosslinking of the coating composition (in the case of a crosslinking coating composition). Such use of photoacid generators is disclosed in U.S. Pat. No. 6,261,743 assigned to the Shipley Company. In particular, with respect to coating compositions that are thermally crosslinked, the coating composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes.

Generally preferred photoacid generators for such use in antireflective compositions or other coating of the invention include e.g. onium salts such as di(4-tert-butylphenyl)iodonium perfluoroctane sulphonate, halogenated non-ionic photoacid generators such as 1,1-bis[p-chlorophenyl]-2,2,2-trichloroethane, and other photoacid generators disclosed for use in photoresist compositions. For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$alkyl or $C_{2-15}$alkenyl having one or preferably two or more fluoro substituents.

Formulation of an Underlying Coating Composition (Second Aspect)

To make a liquid coating composition of the invention, the components of the underlying coating composition are dissolved in a suitable solvent such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. A preferred solvent for an antireflective coating composition of the invention is methyl-2-hydroxyisobutyrate, optionally blended with anisole. The concentration of the dry components in the solvent will depend on several factors such as the method of application. In general, the solids content of an antireflective composition varies from about 0.5 to 20 weight percent of the total weight of the coating composition, preferably the solids content varies from about 2 to 10 weight of the coating composition.

Exemplary Hardmask Systems

A variety of hardmask compositions can be employed comprised of silicon compounds. These materials can be deposited by with chemical vapor deposition from volatile precursors or from Silsesquioxane type oligomers or polymers. Both methods and the materials are well known to those skilled in the art.

Exemplary Photoresist Systems

A variety of photoresist compositions can be employed with coating compositions of the invention, including positive-acting and negative-acting photoacid-generating compositions. Photoresists used with underlying compositions of the invention typically comprise a resin binder and a photoactive component, typically a photoacid generator compound. Preferably the photoresist resin binder has functional groups that impart alkaline aqueous developability to the imaged resist composition.

Particularly preferred photoresists for use with underlying compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793, al of which are incorporated herein by reference for their teaching of making and using chemically amplified positive-acting resists. Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090, 526.

The underlying compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, and iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Suitable photoacid generators to employ in a positive or negative acting photoresist overcoated over a coating composition of the invention include imidosulfonates such as compounds of the following formula:

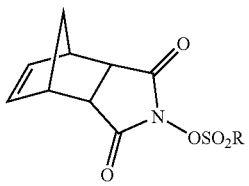

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

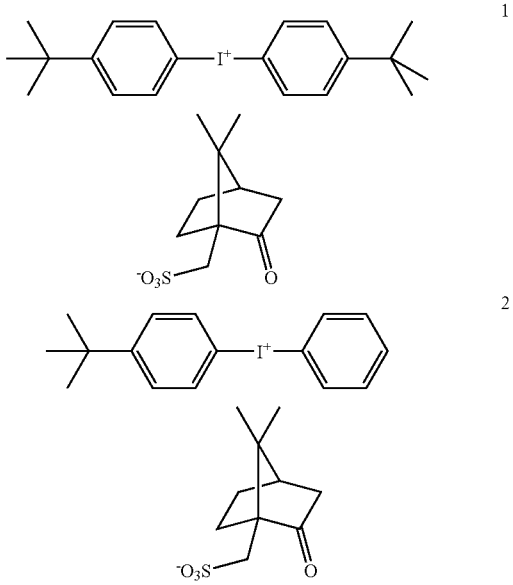

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3-$ where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresist used with underlying coating compositions.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

Suitable photoacid generator compounds of resists used with underlying compositions of the invention include the onium salts, such as those disclosed in U.S. Pat. Nos. 4,442,197, 4,603,10, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonlyoxy ketones. See J. of Photopolymer Science and Technology, 4(3):337-340 (1991), for disclosure of suitable sulfonate PAGS, including benzoin tosylate, t-butylphenyl alpha-(p-toluenesulfonyloxy)-acetate and t-butyl alpha(p-toluenesulfonyloxy)-acetate. Preferred sulfonate PAGs are also disclosed in U.S. Pat. No. 5,344,742 to Sinta et al. The above camphorsulfoanate PAGs 1 and 2 are also preferred photoacid generators for resist compositions used with the underlying compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 50 percent by weight of the total weight of a resist's dry components.

Lithographic Processing of Curable Compositions (First Aspect)

A curable composition may be applied to a substrate (such as a microelectronic wafer) by any convenient method including spin-coating where the composition has been formulated as a solvent-based material.

The coated substrate (e.g. wafer) then may be soft-baked to remove solvent of the applied coating composition, e.g. at 100oC for about 30 or 60 seconds on a vacuum hotplate.

The dried composition layer than may be hardened such as by blanket exposure to activating radiation, e.g. radiation having a wavelength of less than 400 nm or 300 nm to promote curing of one or more composition components.

The hardened coating layer than can be used as an underlayer over which a hardmask composition may be disposed such as by spin-coating, slot coating, dip coating, or vacuum deposition. The hardmask composition suitably may have silicon content.

A photoresist composition may be disposed over the hardmask composition such as by spin coating and described below.

Upon processing of the multiple-layer system, the cured composition layer may be removed using thermal and radiation treatment, e.g. thermal treatment at 250° C. or greater, and without an ash process.

Lithographic Processing of Underlying Coating Compositions Tat are Thermally Deprotectable—(Second Aspect)

In use, a coating composition of the invention is applied as a coating layer to a substrate by any of a variety of methods such as spin coating. The coating composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the antireflective composition. Cure conditions will vary with the components of the coating composition. Typical cure conditions are from about 150° C. to 250° C. for about 0.5 to 5 minutes. Cure conditions preferably render the coating composition coating layer substantially insoluble to the photoresist solvent as well as an alkaline aqueous developer solution.

After such curing, a photoresist is applied above the surface of the top coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed resist coating layer is then developed, preferably with an aqueous based developer such as an alkali exemplified by tetramethyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch.

The following examples are presented to illustrate further various aspects of the present invention, but are not intended to limit the scope of the invention in any aspect.

EXAMPLE 1

Curable Composition and Processing (First Aspect)

An underlayer materials that contains trimethylolpropane trimethacrylate (TMPTMA) and a free-radical polymerization catalyst in propylene glycol monomethyl ether acetate is spin coated onto a wafer. The wafer is then soft-baked to remove the solvent. The resulting underlayer material is next blanket exposed to the appropriate wavelength of actinic radiation to cause polymerization of the TMPTMA to form a crosslinked underlayer material film. This film is then used as an underlayer upon which a silicon-containing hard mask material is disposed.

EXAMPLE 2

Curable Composition and Processing (First Aspect)

The procedure of Example 1 above is repeated except that the material composition contains TMPTMA, a free-radical polymerization catalyst, a co-polymer containing styrene and PETMA as polymerized units in a weight ratio of 70/30 and propylene glycol monomethyl ether acetate.

EXAMPLE 3

Curable Composition and Processing (First Aspect)

The procedure of Example 1 above is repeated except that the material composition contains TMPTMA, a free-radical polymerization catalyst, a co-polymer containing styrene-methylmethacrylate-hydroxyethylmethacrylate as polymerized units in a weight ratio of 10/60/30 and propylene glycol monomethyl ether acetate.

EXAMPLE 4

Curable Composition and Processing (First Aspect)

The procedure of Example 1 above is repeated except that the material composition contains TMPTMA, a free-radical polymerization catalyst, a co-polymer containing dimethylaminoethylmethacrylate-ethylacrylate-methylmethacrylate as polymerized units in a weight ratio of 10/60/30 and propylene glycol monomethyl ether acetate.

EXAMPLE 5

Curable Composition and Processing (First Aspect)

An underlayer material composition containing a thermal free radical polymerization catalyst, a co-polymer containing styrene-methylmethacrylate-hydroxyethylmethacrylate as polymerized units in a weight ratio of 10/60/30 and propylene glycol monomethyl ether acetate is spin coated on a wafer. The wafer is then soft-baked to remove the solvent and cure the film. This film is then used as an underlayer upon which a silicon-containing hard mask material is disposed, such as by spin-coating, slot, dip or vacuum deposition.

EXAMPLE 6

Curable Composition and Processing (First Aspect)

The procedure of Example 5 is repeated except that the underlayer composition contains TMPTMA, a free-radical polymerization catalyst, a co-polymer containing dimethylaminoethylmethacrylate-ethylacrylate-methylmethacrylate as polymerized units in a weight ratio of 30/40/30 and propylene glycol monomethyl ether acetate.

EXAMPLE 7

Thermally Deblocking Compositions (Second Aspect)

A terpolymer (referred to herein as Polymer 1) containing methyl adamantyl methacrylate (MAMMA), alpha-butyoryl lactone methaacrylate (αGBLMA) and 4-hydroxy vinylnaphthalene (HVN) with the respective mole percent monomer content of 30/55/15 was dissolved in propylene glycocol monomethylether acetate (PGMEA) to make a solution containing 10 weight percent of polymer.

A second co-polymer (referred to herein as Polymer 2) containing styrene and t-butylacrylate with the respective mole percent monomer content of 60/40 was dissolved in propylene glycol monomethylether acetate (PGMEA) to make a solution containing 10 weight percent of polymer.

A third co-polymer containing hydropyran, maleic anhydride, norbornene and MAMA (referred to herein as Polymer 3) was dissolved in propylene glycol monomethylether acetate (PGMEA) to make a solution containing 10 weight percent of polymer.

Each of the three polymer solutions (i.e. the solutions containing Polymer 1, Polymer 2 and Polymer 3) are filtered through a 0.2 micron filter and spin-coated onto a 4 inch wafer. The coated wafers with Polymers 1 and 2 were then heated to 250° C. while the film of Polymer 3 was heated at 220° C. to 250° C. on a constant temperature hot plate for 60 seconds and film thickness was determined using a Nonospec 3000 instrument. Film thickness was again measured after the film was immersed for 60 seconds under a puddle of resist solvent and developer. All three under layer polymer compositions showed film thickness loss upon treatment with developer but limited fill thickness loss when treated with resist solvent. The solubility behavior of the three polymers is shown in the following Table 1.

TABLE 1

| | Film thickness (FT) After Bake, Å | FT After Solvent Exposure, Å | | | | FT After Developer Exposure, Å |
|---|---|---|---|---|---|---|
| | | PGMEA | PGME | EL | 2-HN | |
| Polymer 1 | 2201 | 2197 | | | | |
| | 2263 | | 2106 | | | |
| | 2275 | | | 2234 | | |
| | 2257 | | | | 2248 | |
| | 2256 | | | | | 33 |
| Polymer 2 | 2575 | 2565 | | | | |
| | 2576 | | | | 2571 | |
| | 2917 | | | 2363 | | |
| | 2580 | | | | | 2571 |
| Polymer 3 | 1937 | 1931 | | | | |
| | 1919 | | | | | 8 |

EL = Ethyl Lactate;
2-HN = 2-heptanone

The use of an acid catalyst present as a thermal acid generator accelerates the deblocking reaction thus allowing the use of lower bake temperatures. See results of the following Example 8.

EXAMPLE 8

A co-polymer (referred to herein as Polymer 4) containing styrene and t-butylacrylate with the respective mole percent monomer content of 20/80 and a catalytic amount of amine dodecylbenzene sulfonate were dissolved in propylene glycol monomethylether acetate (PGMEA) to make a solution containing 10 weight percent of solids. The polymer solution was then processed using the same procedure used to process polymer solutions of Example 8 except that the bake was carried out at 225° C. The resistance of the thermally treated polymer film to resist solvents and solubility in the developer is shown in Table 2.

TABLE 2

| | Film thickness (FT) After Bake, Å | FT After Solvent Exposure, Å | | | | FT After Developer Exposure, Å |
|---|---|---|---|---|---|---|
| | | PGMEA | PGME | EL | 2-HN | |
| Polymer of Example 8 | 2968 | 2965 | | | | |
| | 2984 | | | 2980 | | |
| | 2980 | | | | 2971 | |
| | 2961 | | | | | 0 |

EXAMPLE 9

Coating Composition Preparation and Lithographic Processing (Second Aspect)

Coating composition prepared in Example 8 is spin coated onto a silicon wafer and cured at a temperature of 225° C. for 60 seconds on a hot plate. A spin-on hard mask was coated on top of the underlayer and cured at 225° C. for 60 second to create a substrate for subsequent lithographic processing.

A commercially available 193 nm photoresist is then spin-coated over the substrate comprised of a spin-on hard mask and underlayer. The applied resist layer is soft-baked at 100° C. for 60 seconds on a hotplate, exposed to patterned 193 nm radiation through a photomask, post-exposure baked at 110° C. for 60 seconds and then developed with 0.26 N aqueous alkaline developer to provide a resist relief image. Aqueous alkaline development also can remove the underlying coating composition.

What is claimed is:

1. A method of preparing an electronic device, comprising:
   (a) applying a coating layer of an organic antireflective composition on a substrate, wherein the antireflective composition comprises a resin that comprises photo-acid-labile groups material that produces alkaline-soluble groups upon thermal treatment or exposure to activating radiation;
   (b) exposing to activating radiation or thermally treating the antireflective composition coating layer to produce COOH groups;
   (c) crosslinking the antireflective composition coating layer with the alkaline-soluble groups;
   (d) applying a photoresist composition layer above the crosslinked antireflective composition coating layer;
   (e) exposing the applied photoresist composition coating layer to patterned activating radiation; and
   (f) treating the exposed photoresist layer with an aqueous alkaline developer composition to develop the patterned image in both the photoresist composition layer and the underlying antireflective composition coating layer.

2. The method of claim 1 wherein the antireflective composition coating layer is thermally treated to produce alkaline-soluble groups.

3. The method of claim 1 wherein the antireflective composition coating layer is exposed to activating radiation to produce alkaline-soluble groups.

4. The method of claim 1 wherein the alkaline-soluble groups react to form anhydride groups.

5. The method of claim 1 wherein the antireflective composition comprises a resin that comprises photoacid-labile ester groups.

6. The method of claim 1 wherein the antireflective composition comprises a resin that comprises photoacid-labile acetal groups.

7. The method of claim 1 wherein the antireflective composition comprises a resin that comprises polymerized t-butylacrylate ester or t-butylmethacrylate ester groups.

* * * * *